(12) United States Patent
Kim et al.

(10) Patent No.: US 7,388,417 B2
(45) Date of Patent: Jun. 17, 2008

(54) OUTPUT CIRCUIT OF A SEMICONDUCTOR MEMORY DEVICE AND METHOD OF OUTPUTTING DATA IN A SEMICONDUCTOR MEMORY DEVICE

(75) Inventors: Kyoung-Ho Kim, Yongin-si (KR); Seong-Jin Jang, Seongnam-si (KR); Joung-Yeal Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 93 days.

(21) Appl. No.: 11/519,252

(22) Filed: Sep. 12, 2006

(65) Prior Publication Data

US 2007/0069788 A1    Mar. 29, 2007

(30) Foreign Application Priority Data

Sep. 27, 2005    (KR) .................. 10-2005-0089840

(51) Int. Cl.
  *H03K 17/62*    (2006.01)
(52) U.S. Cl. ...................... 327/403; 327/199
(58) Field of Classification Search ............. 327/199, 327/208, 214, 225, 403, 404
  See application file for complete search history.

(56) References Cited

U.S. PATENT DOCUMENTS 5,406,134 A * 4/1995 Menut .................. 327/203
6,937,527 B1 * 8/2005 Lotz et al. ............. 365/189.05
2004/0151039 A1   8/2004 Lee et al.

FOREIGN PATENT DOCUMENTS

| KR | 1999-0086391 | 12/1999 |
|---|---|---|
| KR | 10-2000-0008508 | 2/2000 |
| KR | 10-2004-0067602 | 7/2004 |
| KR | 10-2004-0107594 | 12/2004 |

* cited by examiner

*Primary Examiner*—Jeffrey S Zweizig
(74) *Attorney, Agent, or Firm*—Mills & Onello LLP

(57) ABSTRACT

An output circuit of a semiconductor memory device includes a first data path, a second data path and a third data path. The first data path transfers a sense output signal, and latches the sense output signal to output the sense output signal to a first node. The second data path transfers the sense output signal, and latches the sense output signal to output the sense output signal to the first node. The third data path latches a signal of the first node, and transfers the signal of the first node to generate output data. Accordingly, the semiconductor memory device including the output circuit can operate at a relatively higher frequency using a pseudo-pipeline structured circuit, which combines a wave pipeline structure with a full pipeline structure.

25 Claims, 4 Drawing Sheets

OUTPUT CIRCUIT OF A SEMICONDUCTOR MEMORY DEVICE AND METHOD OF OUTPUTTING DATA IN A SEMICONDUCTOR MEMORY DEVICE

CROSS-REFERENCE TO RELATED APPLICATIONS

This application claims priority under 35 USC § 119 to Korean Patent Application No. 10-2005-0089840 filed on Sep. 27, 2005 in the Korean Intellectual Property Office, the entire contents of which are herein incorporated by reference.

BACKGROUND OF THE INVENTION

1. Field of the Invention

The present invention relates to a semiconductor memory device, and more particularly to an output circuit of a semiconductor memory device and a method of outputting data in a semiconductor memory device.

2. Description of the Related Art

Semiconductor memory devices are generally used for data storage and retrieval. Random-access memory (RAM) is a type of a volatile memory, and is primarily used as a main memory of a computer. Dynamic RAM (DRAM) is a type of RAM, and includes memory cells. Each of the memory cells includes a cell transistor and a cell capacitor, and store data in the form of electric charge in the cell capacitor which is translated to binary "0" and "1".

Each of the memory cells of the DRAM is coupled to a word line and a bit line. When the cell transistor is turned on in response to a word line enable signal, the data stored in the cell capacitor are output to the bit line, or the data of the bit line are stored in the cell capacitor.

FIG. 1 is a block diagram illustrating a structure of a conventional semiconductor memory device, for example, of the type disclosed in Korean Patent Laid-Open Publication No. 2000-8508.

Referring to FIG. 1, the semiconductor memory device includes a plurality of memory cells 10a, 10b, ..., 10n, a plurality of precharging and equalizing circuits 20a, 20b, ..., 20n, a row address decoder 40, a plurality of column selection switches 30a, 30b, ..., 30n, a column address decoder 50, a sense amplifier 60 and an output circuit 70.

The row address decoder 40 decodes a row address X to generate a plurality of word line selection signals WL1, WL2, ..., WLn. In response to the word line selection signals WL1, WL2, ..., WLn, the memory cells 10a, 10b, ..., 10n are selected. The precharging and equalizing circuits 20a, 20b, ..., 20n precharge and equalize a plurality of pairs of bit lines BL1 and BLB1, BL2 and BLB2, ..., BLn and BLBn during a read operation. The column address decoder 50 decodes a column address Y to generate a plurality of column selection signals Y1, Y2, ..., Yn. Each of the column selection switches 30a, 30b, ..., 30n transfers data, which is received from the pair of bit lines that is selected in response to each of the column selection signals Y1, Y2, ..., Yn, to a corresponding pair of data lines DLk and DLBk. When the sense amplifier 60 is enabled during the read operation, the sense amplifier 60 senses a voltage difference between data transferred from the pair of data lines DL and DLB to amplify the voltage difference between the data, and generates a sense output signal SAS. The output circuit 70 buffers the sense output signal SAS to generate output data DQ.

As the operating speed of semiconductor memory devices is increased, the output circuit requires a predetermined delay time interval for outputting data. A time interval tAA corresponding to a period from a time at which a read command is input, to a time at which corresponding data is output from the output circuit 70 can be varied depending on a manufacturing process. Conventional semiconductor memory devices commonly employ a column address strobe (CAS) latency 4 (CL4) pipeline mode or a CAS latency 3 (CL3) pipeline mode. The CL4 pipeline mode further includes a switching operation, unlike the CL3 pipeline mode. The CL3 pipeline mode outputs corresponding data when three clock cycles elapse after the read command is input. The CL4 pipeline mode outputs corresponding data when four clock cycles elapse after the read command is input. For example, when the time interval tAA is about 30 ns and one clock cycle is about 10 ns, the CL3 pipeline mode has to output corresponding data within about 30 ns of elapsed time after the read command is input. Accordingly, an operating margin of the CL3 pipeline mode is insufficient. However, the CL4 pipeline mode outputs corresponding data within about 40 ns of elapsed time after the read command is input; thus, because the time interval tAA is about 30 ns, an operating margin of the CL4 pipeline mode is about 10 ns. As a result, when the CL4 pipeline mode is employed instead of the CL3 pipeline mode, limitations of the time interval tAA can be relieved.

When the operating speed of a semiconductor memory device is increased, there can be a phase inversion between switch control signals for controlling the output circuit of the semiconductor memory device. For example, when a phase of one switch control signal lags behind that of an external clock signal and a phase of another switch control signal leads that of the external clock signal, a phase inversion can occur between the two switch control signals as the frequency of the external clock signal becomes higher. That is, because a phase inversion phenomenon can occur between the switch control signals even in the conventional CL4 pipeline mode, an operating frequency of the semiconductor memory device is thereby limited.

SUMMARY OF THE INVENTION

Accordingly, the present invention is provided to substantially obviate one or more problems due to limitations and disadvantages of the related art.

Embodiments of the present disclosure provide an output circuit that is capable of operating at a relatively higher frequency in a semiconductor memory device.

Embodiments of the present disclosure also provide a semiconductor memory device capable of operating at a relatively higher frequency.

Embodiments of the present disclosure also provide a method of outputting data in a semiconductor memory device that is capable of operating at a relatively higher frequency.

In accordance with one aspect of the present disclosure, an output circuit of a semiconductor memory device includes a first data path, a second data path and a third data path. The first data path transfers a sense output signal received from a sense amplifier in response to a first control signal and a second control signal, and latches the sense output signal to output the sense output signal to a first node. The second data path transfers the sense output signal in response to a third control signal and a fourth control signal, and latches the sense output signal to output the sense output signal to the first node, in which the third control signal is complementary to the first control signal and the fourth control signal is complementary to the second control signal. The third data path latches a signal received at the first node in response to a fifth control signal to generate output data.

The first control signal can be generated in response to a read command and an external clock signal.

A first clock gap can exist between the first control signal and the second control signal. The first clock gap can correspond to one clock cycle of an external clock signal.

A second clock gap can exist between the third control signal and the fourth control signal. The second clock gap can correspond to one clock cycle of an external clock signal.

A transition of the first control signal can be delayed by a first time period from a rising edge of an external clock signal, and a transition of the second control signal can be in advance of a rising edge of the external clock signal by a second time period.

The fifth control signal can correspond to an output clock signal. The output clock signal can be generated in response to the external clock signal.

The output data can be generated in synchronization with the output clock signal.

The first data path can comprise: a first switch configured to transfer the sense output signal in response to the first control signal; a latch circuit configured to latch an output signal of the first switch; and a second switch configured to transfer an output signal of the latch circuit in response to the second control signal. The first switch and the second switch can each include a transmission gate that is implemented with a complementary metal-oxide semiconductor (CMOS) transistor.

The first data path can alternatively comprise: a first switch configured to transfer the sense output signal in response to the first control signal; an inverter configured to invert an output signal of the first switch; a latch circuit configured to latch an output signal of the first inverter; and a second switch configured to transfer an output signal of the latch circuit in response to the second control signal. The first switch and the second switch can each include a transmission gate that is implemented with a CMOS transistor.

The second data path can comprise: a first switch configured to transfer the sense output signal in response to the third control signal; a latch circuit configured to latch an output signal of the first switch; and a second switch configured to transfer an output signal of the latch circuit in response to the fourth control signal. The first switch and the second switch can each include a transmission gate that is implemented with a CMOS transistor.

The second data path can alternatively comprise: a first switch configured to transfer the sense output signal in response to the third control signal; an inverter configured to invert an output signal of the first switch; a latch circuit configured to latch an output signal of the inverter; and a second switch configured to transfer an output signal of the latch circuit in response to the fourth control signal. The first switch and the second switch can each include a transmission gate that is implemented with a CMOS transistor.

The third data path can comprise: an inverter configured to invert an output signal of the first node; a latch circuit configured to latch an output signal of the inverter; and a switch configured to transfer an output signal of the latch circuit in response to the fifth control signal. The switch can include a transmission gate that is implemented with a CMOS transistor.

The output circuit can further comprise: a first flip-flop configured to generate the first control signal and the third control signal in response to a first output data control signal; and a second flip-flop configured to generate the second control signal and the fourth control signal in response to a second output data control signal.

In accordance with another aspect of the present disclosure, a semiconductor memory device includes a memory cell array, a sense amplifier configured to amplify data output from the memory cell array to generate a sense output signal, and an output circuit configured to perform a gating of the sense output signal, and to latch the sense output signal, in which the output circuit includes a first data path, a second data path and a third data path. The first data path transfers the sense output signal in response to a first control signal and a second control signal, and latches the sense output signal to output the sense output signal to a first node. The second data path transfers the sense output signal in response to a third control signal complementary to the first control signal and a fourth control signal complementary to the second control signal, and latches the sense output signal to output the sense output signal to the first node. The third data path latches a signal received at the first node in response to a fifth control signal to generate output data.

A transition of the first control signal can be delayed by a first time period from a rising edge of an external clock signal, and a transition of the second control signal can be in advance of a rising edge of the external clock signal by a second time period.

In accordance with another aspect of the present disclosure, a method of outputting data in a semiconductor memory device includes: outputting a sense output signal to a first node by transferring the sense output signal in response to a first control signal and a second control signal, and latching the sense output signal; outputting the sense output signal to the first node by transferring the sense output signal in response to a third control signal complementary to the first control signal and a fourth control signal complementary to the second control signal, and latching the sense output signal; and generating output data by latching a signal received at the first node in response to a fifth control signal.

A transition of the first control signal can be delayed by a first time period from a rising edge of an external clock signal, and a transition of the second control signal can be in advance of a rising edge of the external clock signal by a second time period.

Therefore, the semiconductor memory device including the output circuit according to example embodiments can operate at a relatively higher frequency and can be configured with a pseudo-pipeline of a relatively simple structure in which a wave pipeline structure and a full pipeline structure are combined.

BRIEF DESCRIPTION OF THE DRAWINGS

Example embodiments of the present invention will become more apparent by describing in detail example embodiments with reference to the accompanying drawings, in which.

DETAILED DESCRIPTION OF EMBODIMENTS

Figure 1:
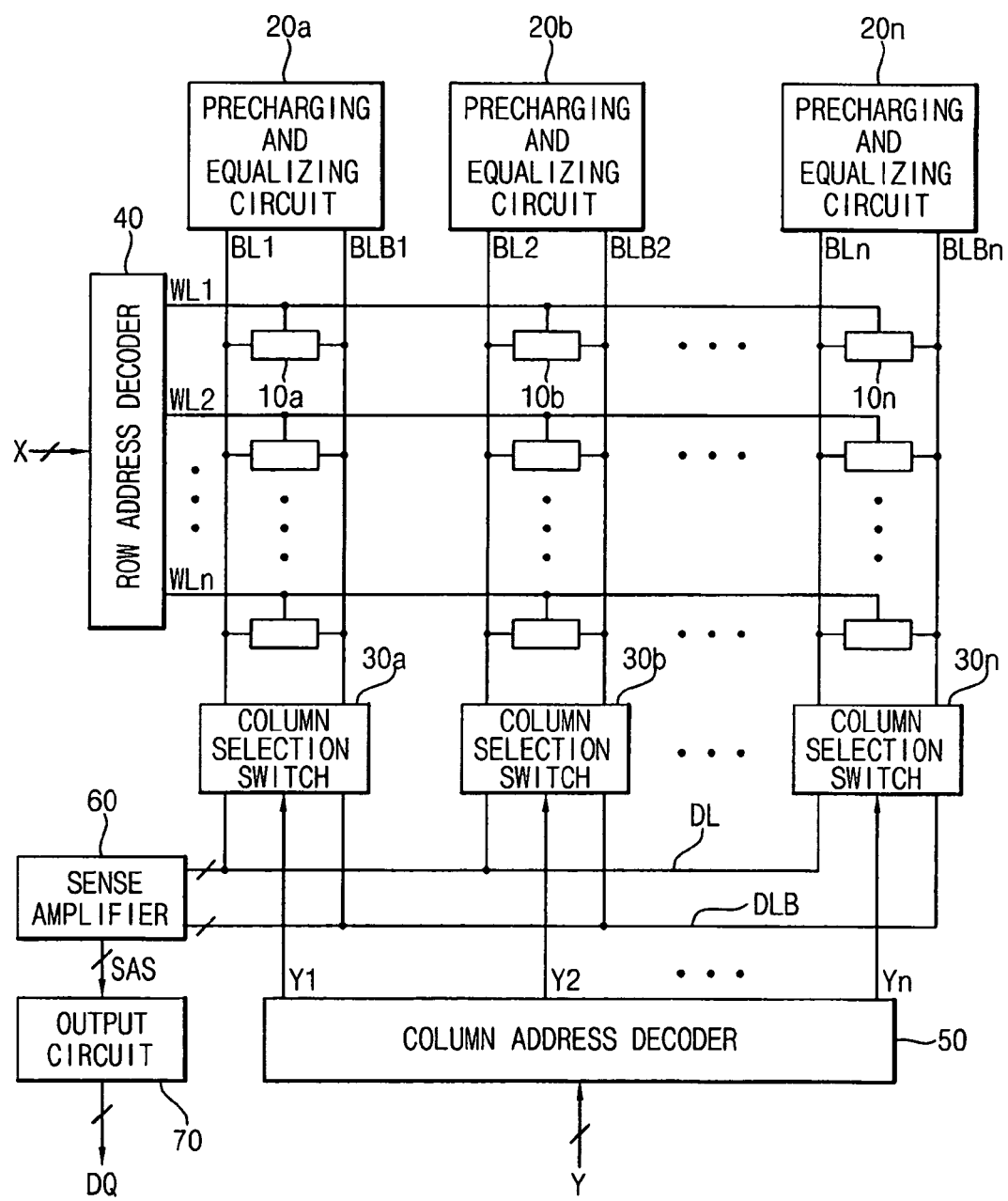
FIG. 1 is a block diagram illustrating a structure of a conventional semiconductor memory device.

Detailed illustrative embodiments of the present invention are disclosed herein. However, specific structural and functional details disclosed herein are merely representative for purposes of describing example embodiments of the present invention. This invention can, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will also be understood that, although the terms first, second, etc. can be used herein to describe various elements, these elements should not be limited by these terms. These terms are used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprise", "comprises," "comprising," "include," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 2:
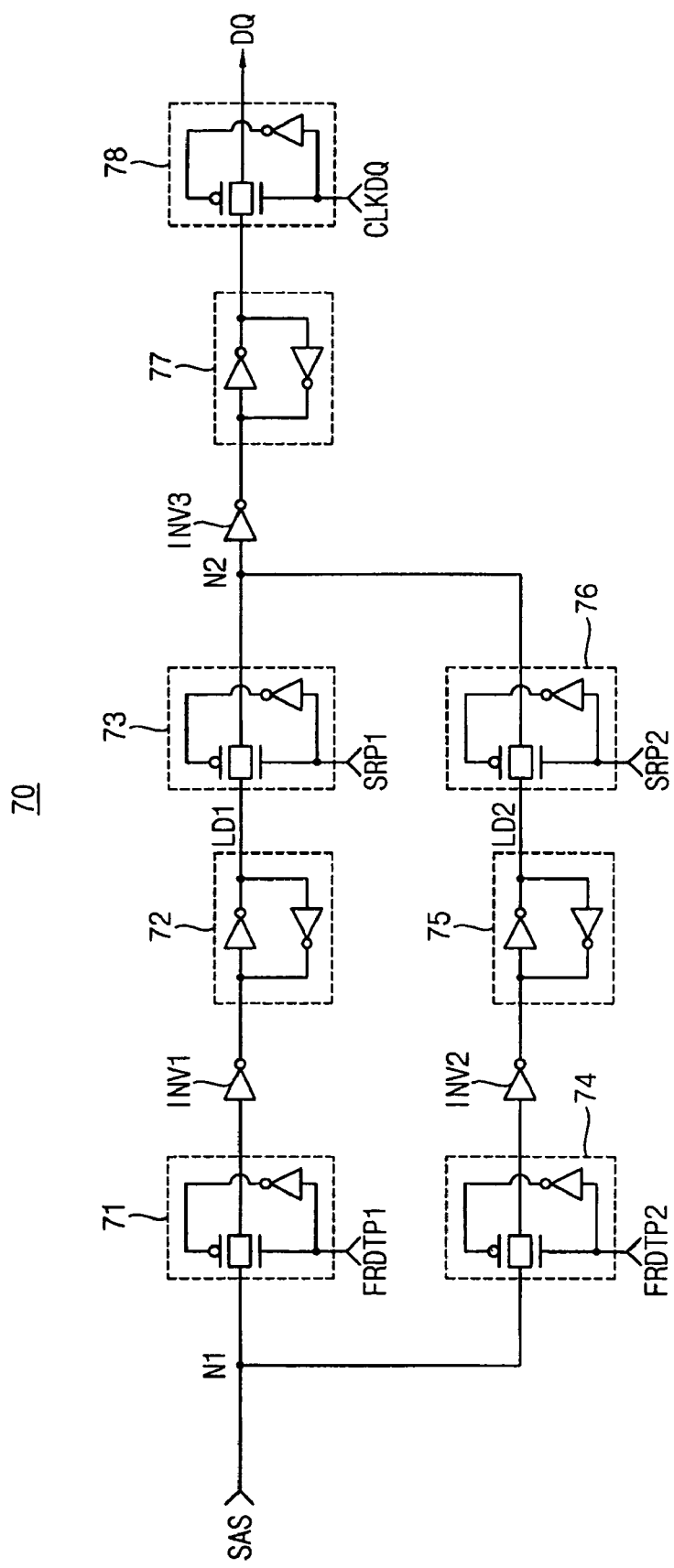
FIG. 2 is a circuit diagram illustrating an output circuit of a semiconductor memory device according to an example embodiment of the present invention.

FIG. 2 is a circuit diagram illustrating an output circuit of a semiconductor memory device according to an example embodiment of the present invention.

Referring to FIG. 2, the output circuit 70 of the semiconductor memory device includes switches 71, 73, 74, 76 and 78, latch circuits 72, 75 and 77, and inverters, INV2 and INV3. The switch 71, the optional inverter INV1, the latch circuit 72 and the switch 73 form a first data path. The switch 74, the optional inverter INV2, the latch circuit 75 and the switch 76 form a second data path. The inverter INV3, the latch circuit 77 and the switch 78 form a third data path. Each of the switches 71, 73, 74, 76 and 78 can include a transmission gate that is implemented with a complementary metal-oxide semiconductor (CMOS) device.

The first data path receives a sense output signal SAS through a node N1, performs a gating of the sense output signal SAS in response to a first control signal FRDTP1 and a second control signal SRP1, and latches the sense output signal SAS to output the sense output signal SAS to a node N2. The second data path receives the sense output signal SAS through the node N1, performs a gating of the sense output signal SAS in response to a third control signal FRDTP2 and a fourth control signal SRP2, and latches the sense output signal SAS to output the sense output signal SAS to the node N2. The third control signal FRDTP2 is complementary to the first control signal FRDTP1, and the fourth control signal SRP2 is complementary to the second control signal SRP1. The third data path latches the sense output signal SAS received through the node N2 in response to a fifth control signal CLKDQ, and performs a gating of the sense output signal SAS to provide output data DQ. Complementary relationships between the control signals are as follows. When a pulse of the first control signal FRDTP1 is generated, a pulse of the third control signal FRDTP2 is not generated, and when the pulse of the third control signal FRDTP2 is generated, the pulse of the first control signal FRDTP1 is not generated. Similarly, when a pulse of the second control signal SRP1 is generated, a pulse of the fourth control signal SRP2 is not generated, and when the pulse of the fourth control signal SRP2 is generated, the pulse of the second control signal SRP1 is not generated.

The switch 71 transfers the sense output signal SAS in response to the first control signal FRDTP1. The inverter INVL inverts an output signal of the switch 71. The latch circuit 72 latches an output signal of the inverter INV1. The switch 73 transfers an output signal LD1 of the latch circuit 72 in response to the second control signal SRP1.

The switch 74 transfers the sense output signal SAS in response to the third control signal FRDTP2. The inverter INV2 inverts an output signal of the switch 74. The latch circuit 75 latches an output signal of the inverter INV2. The switch 76 transfers an output signal LD2 of the latch circuit 75 in response to the fourth control is signal SRP.

The inverter INV3 inverts an output signal of the node N2. The latch circuit 77 latches an output signal of the inverter INV3. The switch 78 transfers an output signal of the latch circuit 77 in response to the fifth control signal CLKDQ.

Figure 3:
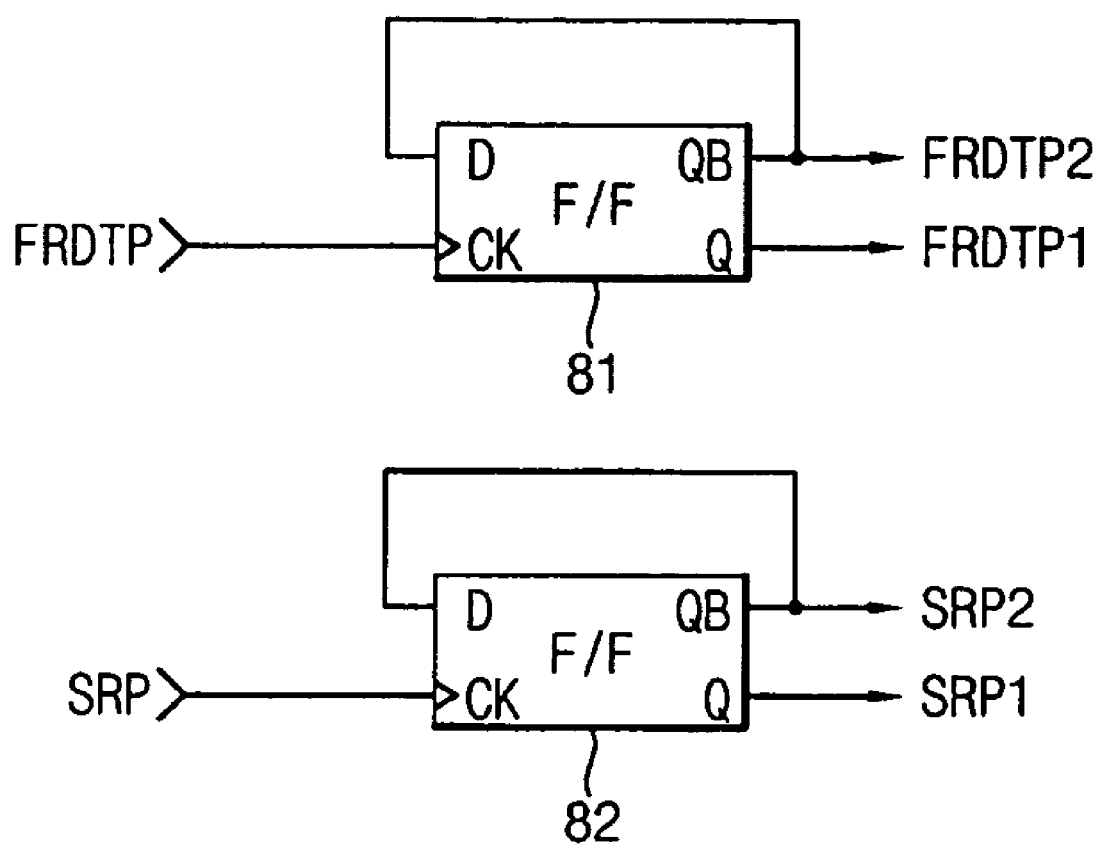
FIG. 3 is a schematic circuit diagram illustrating a control signal generator for generating control signals that are used for an output circuit of the semiconductor memory device shown in FIG. 2.

FIG. 3 is a schematic circuit diagram illustrating a control signal generator for generating control signals that are used for an output circuit of a semiconductor memory device in accordance with embodiments of the present disclosure, for example, of the device shown in FIG. 2.

In the present example, the control signal generator can be implemented with flip-flops 81 and 82, as shown.

The flip-flop 81 generates a first control signal FRDTP1 and a third control signal FRDTP2 in response to a first output data control signal FRDTP, and the flip-flop 82 generates a second control signal SRP1 and a fourth control signal SRP2 in response to a second output data control signal SRP.

Figure 4:
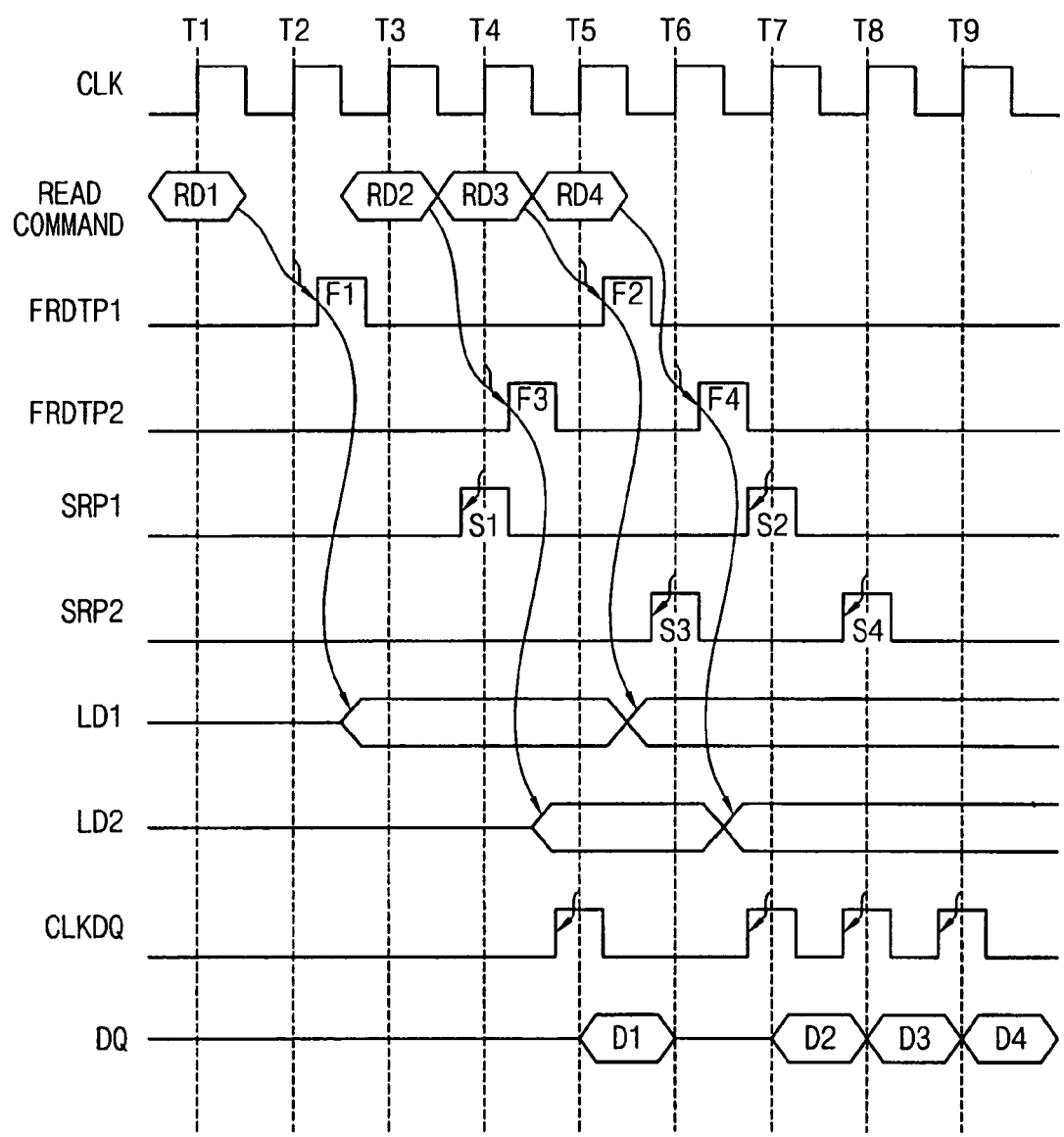
FIG. 4 is a timing diagram that illustrates the operations of a semiconductor memory device having an output circuit according to an example embodiment of the present invention.

FIG. 4 is a timing diagram that illustrates operations of a semiconductor memory device having an output circuit according to an example embodiment of the present invention. Hereinafter, operations of an output circuit 70 included in a semiconductor memory device according to an example embodiment of the present invention will be described with reference to FIGS. 2, 3 and 4.

Referring back to FIG. 1, the sense amplifier 60 is enabled during the read operation, senses a voltage difference between data transferred from the pair of data lines DL and DLB, and amplifies the voltage difference to generate the sense output signal SAS. The output circuit 70 buffers the sense output signal SAS to generate output data DQ.

Referring to FIG. 3, the first control signal FRDTP1 is complementary to the third control signal FRDTP2. The first control signal FRDTP1 and the third control signal FRDTP2 are generated by the flip-flop 81 in response to the first output data control signal FRDTP. The first output data control signal FRDTP is generated in response to the external clock signal CLK. The second control signal SRP1 is complementary to the fourth control signal SRP2. The second control signal SRP1 and the fourth control signal SRP2 are generated by the flop-flop 82 in response to the second output data control signal SRP. The second output data control signal SRP has a clock rate that is higher than that of the external clock signal CLK. A delay-locked loop (DLL) clock signal that controls a DLL included in the semiconductor memory device can be used as the second output data control signal SRP.

Referring to the illustration of FIG. 4, an external clock signal CLK of 9 cycles is illustrated and the read command READ is input four times. The time points T1, T2, T3, T4, T5, T6, T7, T8 and T9 correspond to rising edges of the external clock signal CLK.

A first pulse F1 of the first control signal FRDTP1 is generated in response to the read command RD1 and is delayed by a predetermined time period from the time point T2. A second pulse F2 of the first control signal FRDTP1 is generated in response to the read command RD3 and is delayed by a predetermined time period from the time point T5. Any of the predetermined time periods referred to herein can be determined, for example, according to the response requirements of the device.

A first pulse F3 of the third control signal FRDTP2 is generated in response to the read command RD2 and is delayed by a predetermined time period from the time point is T4. A second pulse F4 of the third control signal FRDTP2 is generated in response to the read command RD4 and is delayed by a predetermined time period from the time point T6.

A first pulse S1 of the second control signal SRP1 is generated in advance of the time point T4 by as much as a predetermined time period, and a second pulse S2 of the second control signal SRP1 is generated in advance of the time point T7 by as much as a predetermined time period.

A first pulse S3 of the fourth control signal SRP2 is generated ahead of the time point T6 by as much as a predetermined time period, and a second pulse S4 of the fourth control signal SRP2 is generated ahead of the time point T8 by as much as a predetermined time period.

The output signal LD1 of the latch circuit 72 shown in FIG. 2 is generated in response to the first pulse F1 and the second pulse F2 respectively of the first control signal FTDTP1, and the output signal LD2 of the latch circuit 75 shown in FIG. 2 is generated in response to the first pulse F3 and the second pulse F4 respectively of the third control signal FRDTP2.

The output data DQ is generated in response to the output signal LD1 of the latch circuit 72 shown in FIG. 2 and the output signal LD2 of the latch circuit 75 shown in FIG. 2 respectively, and in synchronization with an output clock signal CLKDQ.

As shown in FIG. 4, a first output data D1 is generated in response to the first pulse F1 of the first control signal FRDTP1, a second output data D2 is generated in response to the first pulse F3 of the third control signal FRDTP2, a third output data D3 is generated in response to the second pulse F2 of the first control signal FRDTP1, and a fourth output data D4 is generated in response to the second pulse F4 of the third control signal FRDTP2. That is, the output data DQ is generated in alternating response to the first control signal FRDTP1 controlling the switch 71 included in the first data path and the third control signal FRDTP2 controlling the switch 74 included in the second data path.

Referring to FIG. 4, there is one clock gap between the first pulse F1 of the first control signal FRDTP1 and the first pulse S1 of the second control signal SRP1, and there is one clock gap between the second pulse F2 of the first control signal FRDTP1 and the second pulse S2 of the second control signal SRP1. Similarly, there is one clock gap between the first pulse F3 of the third control signal FRDTP2 and the first pulse S3 of the fourth control signal SRP2, and there is one clock gap between the second pulse F4 of the third control signal FRDTP2 and the second pulse S4 of the fourth control signal SRP2. For example, the first pulse F1 of the first control signal FRDTP1 is generated based on the time point T2, and the first pulse S1 of the second control signal SRP1 is generated in advance of a predetermined time period from the time point T4 based on the time point T4.

As described above, because there is a clock gap between a pulse of the first control signal FRDTP1 controlling the switch 71 and a pulse of the second control signal SRP1 controlling the switch 73, the possibility of a phase inversion between the pulse of the first control signal FRDTP1 and the pulse of the second control signal SRP1 can be mitigated or eliminated.

As illustrated in FIG. 4, after the read command RD1 is input and four external clock signals are generated, the first output data D1 is generated. That is, the output circuit 70 of the semiconductor memory device according to an example embodiment of the present invention is capable of operating in the CL4 pipeline mode using only three control signals, namely, the first output data control signal FRDPT, the second output data control signal SRP and the output clock signal CLKDQ.

Referring back to FIG. 2, a wave pipeline-gating mode is used between the node N1 and the node N2 and a full pipeline-gating mode is used between the node N2 to the output of the output data DQ.

In the described embodiments of the disclosure, the output circuit of the semiconductor memory device can operate in the CL4 pipeline mode; however, it is apparent to one of ordinary skill in the art that the output circuit of the semiconductor memory device according to other example embodiments of the disclosure can be employed be used to output data in devices operating in modes other than the CL4 pipeline mode.

As mentioned above, the semiconductor memory device including the output circuit according to an example embodiment of the disclosure can operate at a relatively higher frequency and can be configured with a pseudo-pipeline of a simple structure where a wave pipeline structure and a full pipeline structure are combined.

While the example embodiments of the present invention and their advantages have been described in detail, it should be understood that various changes, substitutions and alterations may be made herein without departing from the scope of the invention.

What is claimed is:

1. An output circuit of a semiconductor memory device, comprising:
a first data path configured to transfer a sense output signal received from a sense amplifier in response to a first control signal and a second control signal, and configured to latch the sense output signal to output the sense output signal to a first node;
a second data path configured to transfer the sense output signal in response to a third control signal and a fourth control signal, and configured to latch the sense output signal to output the sense output signal to the first node, the third control signal being complementary to the first control signal and the fourth control signal being complementary to the second control signal; and
a third data path configured to latch a signal received at the first node in response to a fifth control signal to generate output data.

2. The output circuit of claim 1, wherein, the first control signal is generated in response to a read command and an external clock signal.

3. The output circuit of claim 1, wherein a first clock gap exists between the first control signal and the second control signal.

4. The output circuit of claim 3, wherein the first clock gap corresponds to one clock cycle of an external clock signal.

5. The output circuit of claim 1, wherein a second clock gap exists between the third control signal and the fourth control signal.

6. The output circuit of claim 5, wherein the second clock gap corresponds to one clock cycle of an external clock signal.

7. The output circuit of claim 1, wherein a transition of the first control signal is delayed by a first time period from a rising edge of an external clock signal, and a transition of the second control signal is in advance of a rising edge of the external clock signal by a second time period.

8. The output circuit of claim 7, wherein the fifth control signal corresponds to an output clock signal.

9. The output circuit of claim 8, wherein the output clock signal is generated in response to the external clock signal.

10. The output circuit of claim 8, wherein the output data is generated in synchronization with the output clock signal.

11. The output circuit of claim 8, wherein the first data path comprises:
a first switch configured to transfer the sense output signal in response to the first control signal;
a latch circuit configured to latch an output signal of the first switch; and
a second switch configured to transfer an output signal of the latch circuit in response to the second control signal.

12. The output circuit of claim 11, wherein the first switch and the second switch each include a transmission gate that is implemented with a complementary metal-oxide semiconductor (CMOS) transistor.

13. The output circuit of claim 8, wherein the first data path comprises:
a first switch configured to transfer the sense output signal in response to the first control signal;
an inverter configured to invert an output signal of the first switch;
a latch circuit configured to latch an output signal of the first inverter; and
a second switch configured to transfer an output signal of the latch circuit in response to the second control signal.

14. The output circuit of claim 13, wherein the first switch and the second switch each include a transmission gate that is implemented with a CMOS transistor.

15. The output circuit of claim 8, wherein the second data path comprises:
a first switch configured to transfer the sense output signal in response to the third control signal;
a latch circuit configured to latch an output signal of the first switch; and
a second switch configured to transfer an output signal of the latch circuit in response to the fourth control signal.

16. The output circuit of claim 15, wherein the first switch and the second switch each include a transmission gate that is implemented with a CMOS transistor.

17. The output circuit of claim 8, wherein the second data path comprises:
a first switch configured to transfer the sense output signal in response to the third control signal;
an inverter configured to invert an output signal of the first switch;
a latch circuit configured to latch an output signal of the inverter; and
a second switch configured to transfer an output signal of the latch circuit in response to the fourth control signal.

18. The output circuit of claim 17, wherein the first switch and the second switch each include a transmission gate that is implemented with a CMOS transistor.

19. The output circuit of claim 8, wherein the third data path comprises:
an inverter configured to invert an output signal of the first node;
a latch circuit configured to latch an output signal of the inverter; and
a switch configured to transfer an output signal of the latch circuit in response to the fifth control signal.

20. The output circuit of claim 19, wherein the switch includes a transmission gate that is implemented with a CMOS transistor.

21. The output circuit of claim 1, further comprising:
a first flip-flop configured to generate the first control signal and the third control signal in response to a first output data control signal; and
a second flip-flop configured to generate the second control signal and the fourth control signal in response to a second output data control signal.

22. A semiconductor memory device comprising:
a memory cell array;
a sense amplifier configured to amplify data output from the memory cell array to generate a sense output signal; and
an output circuit configured to perform a gating of the sense output signal, and to latch the sense output signal, wherein the output circuit comprises:
a first data path configured to transfer the sense output signal in response to a first control signal and a second control signal, and configured to latch the sense output signal to output the sense output signal to a first node;

a second data path configured to transfer the sense output signal in response to a third control signal complementary to the first control signal and a fourth control signal complementary to the second control signal, and configured to latch the sense output signal to output the sense output signal to the first node; and a third data path configured to latch a signal received at the first node in response to a fifth control signal to generate output data.

23. The semiconductor memory device of claim 22, wherein a transition of the first control signal is delayed by a first time period from a rising edge of an external clock signal, and a transition of the second control signal is in advance of a rising edge of the external clock signal by a second time period.

24. A method of outputting data in a semiconductor memory device, the method comprising:

outputting a sense output signal to a first node by transferring the sense output signal in response to a first control signal and a second control signal, and latching the sense output signal;

outputting the sense output signal to the first node by transferring the sense output signal in response to a third control signal complementary to the first control signal and a fourth control signal complementary to the second control signal, and latching the sense output signal; and generating output data by latching a signal received at the first node in response to a fifth control signal.

25. The method of claim 24, wherein a transition of the first control signal is delayed by a first time period from a rising edge of an external clock signal, and a transition of the second control signal is in advance of a rising edge of the external clock signal by a second time period.

* * * * *